US008036016B2

(12) United States Patent
Sarker et al.

(10) Patent No.: US 8,036,016 B2
(45) Date of Patent: Oct. 11, 2011

(54) MAINTENANCE PROCESS TO ENHANCE MEMORY ENDURANCE

(75) Inventors: Joy Sarker, Mountain View, CA (US); Robert Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 12/552,246

(22) Filed: Sep. 1, 2009

(65) Prior Publication Data

US 2011/0051507 A1 Mar. 3, 2011

(51) Int. Cl.
G11B 5/10 (2006.01)
(52) U.S. Cl. ........................................ 365/148; 365/163
(58) Field of Classification Search ............... 365/163.1, 365/148, 189.09, 230.03
See application file for complete search history.

(56) References Cited

U.S. PATENT DOCUMENTS

| 6,496,417 | B1 * | 12/2002 | Shiau et al. ................. 365/185.2 |
| 6,563,745 | B1 * | 5/2003 | Ilkbahar .................... 365/189.07 |
| 7,552,272 | B2 * | 6/2009 | Gonzalez et al. ............. 711/103 |
| 7,561,466 | B2 * | 7/2009 | Roohparvar ............. 365/185.09 |
| 2004/0160839 | A1 | 8/2004 | Kim |
| 2004/0264264 | A1 | 12/2004 | Yaegashi et al. |
| 2006/0050576 | A1 * | 3/2006 | Kim .............................. 365/200 |
| 2006/0140009 | A1 | 6/2006 | Lojek |
| 2008/0155301 | A1 * | 6/2008 | Ahvenainen et al. ............. 714/1 |
| 2009/0168504 | A1 * | 7/2009 | Lee et al. ....................... 365/163 |
| 2009/0201721 | A1 * | 8/2009 | Ha et al. ........................ 365/163 |

OTHER PUBLICATIONS

Ielmini et al., "A new charge-trapping technique to extract SILC-Trap time constants in $SiO_2$", IEDM Tech. Dig., S22.2, 4 pages, 2005.
U.S. Appl. No. 12/572,182: Notice of Publication, mailed Apr. 7, 2011, 1 page.
U.S. Appl. No. 13/089,259: Application as filed on Apr. 18, 2011, 40 pages.
U.S. Appl. No. 13/089,259: Filing Receipt and Notice to File Corrected Application, mailed on Apr. 29, 2011, 5 pages.

* cited by examiner

*Primary Examiner* — Amir Zarabian
*Assistant Examiner* — Min Huang
(74) *Attorney, Agent, or Firm* — Berkeley Law & Technology Group, LLP (57) ABSTRACT

Subject matter disclosed herein relates to enhancing an operational lifespan of non-volatile memory.

20 Claims, 5 Drawing Sheets

MAINTENANCE PROCESS TO ENHANCE MEMORY ENDURANCE

BACKGROUND

1. Field

Subject matter disclosed herein relates to enhancing an operational lifespan of non-volatile memory.

2. Information

Phase change memory (PCM) may operate based, at least in part, on behaviors and properties of one or more particular phase change materials, such as chalcogenide glass and/or germanium antimony telluride (GST), just to name a few examples. Crystalline and amorphous states of such materials have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: PCM may also be used to store multiple memory states, represented by varying degrees of phase change material resistivity, for example.

Among other possibilities, PCM may fail to operate properly because of a set failure or a reset failure. Such failures may lead to a shortened operational lifespan of a PCM memory.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a PCM memory cell may be reset by melting phase change material by applying relatively high amplitude, relatively short duration electrical programming pulse. In contrast, such a memory cell may be set by applying a relatively smaller, sub-melt amplitude electrical programming pulse having a relatively longer duration, possibly with a gradual, sloping drop, for example. Herein, such a reset and/or set pulse and process are referred to as a "write" pulse and a "write" process. As explained in detail below, such write processes may fail at some time during PCM operation.

PCM endurance, which may be represented by an operational lifespan of a PCM, may be limited by occurrences of set fails and/or write fails. A condition that may lead to a write fail may include a degradation and/or failure of a heater within a PCM. On the other hand, a condition that may lead to a set fail may include development of one or more voids or defects in the phase change material. Such voids may result from migration of phase change material and/or impurity elements during operation of a PCM, for example. Such operation of a PCM may comprise a storage mode of operation that includes multiple operational cycles, described in further detail below. A storage mode of operation refers to a memory that is operated to read, write, and/or store information, such as binary data, over multiple cycles.

In an embodiment, after a period of operating a non-volatile memory device in a storage mode, a maintenance pulse may be applied to one or more memory cells of the non-volatile memory device in order to reduce and/or eliminate voids and/or defects that may result from such a storage mode of operation. Such maintenance pulses may prevent and/or mitigate voids and/or defects arising from prior operational cycles, for example. Repairing memory cells of a non-volatile memory device by eliminating such voids and/or defects may increase an operational lifespan of the non-volatile memory device. Such a maintenance pulse may be applied to one or more memory cells that already include voids and/or defects or are in beginning stages of developing voids and/or defects, such as increased electro-migration of phase change material and/or impurity elements. Of course, details of such voids and/or defects are merely examples, and claimed subject matter is not so limited.

In a particular embodiment, a non-volatile memory device may be operated in a storage mode, using a write pulse comprising a first current amplitude and a first duration, described below in further detail. Such a non-volatile memory device may be partitioned into at least a first portion that is to be subject to a maintenance process and another portion, which may operate in a storage mode during such a maintenance process of the first portion, though claimed subject matter is not so limited. Accordingly, a memory cell maintenance process may be applied to the first portion of memory in order to extend an operational lifespan of the first portion of memory. After completion of such a maintenance portion, the first portion may be returned to a storage mode operation.

Embodiments of a maintenance process described herein may provide enhanced longevity of PCM arrays by using software and/or other executable instructions that instruct one or more specialized processors to carry out a maintenance process. In contrast, attempting to improve endurance of a PCM using process/manufacturing techniques during fabrication of a PCM may be relatively difficult.

Figure 1:
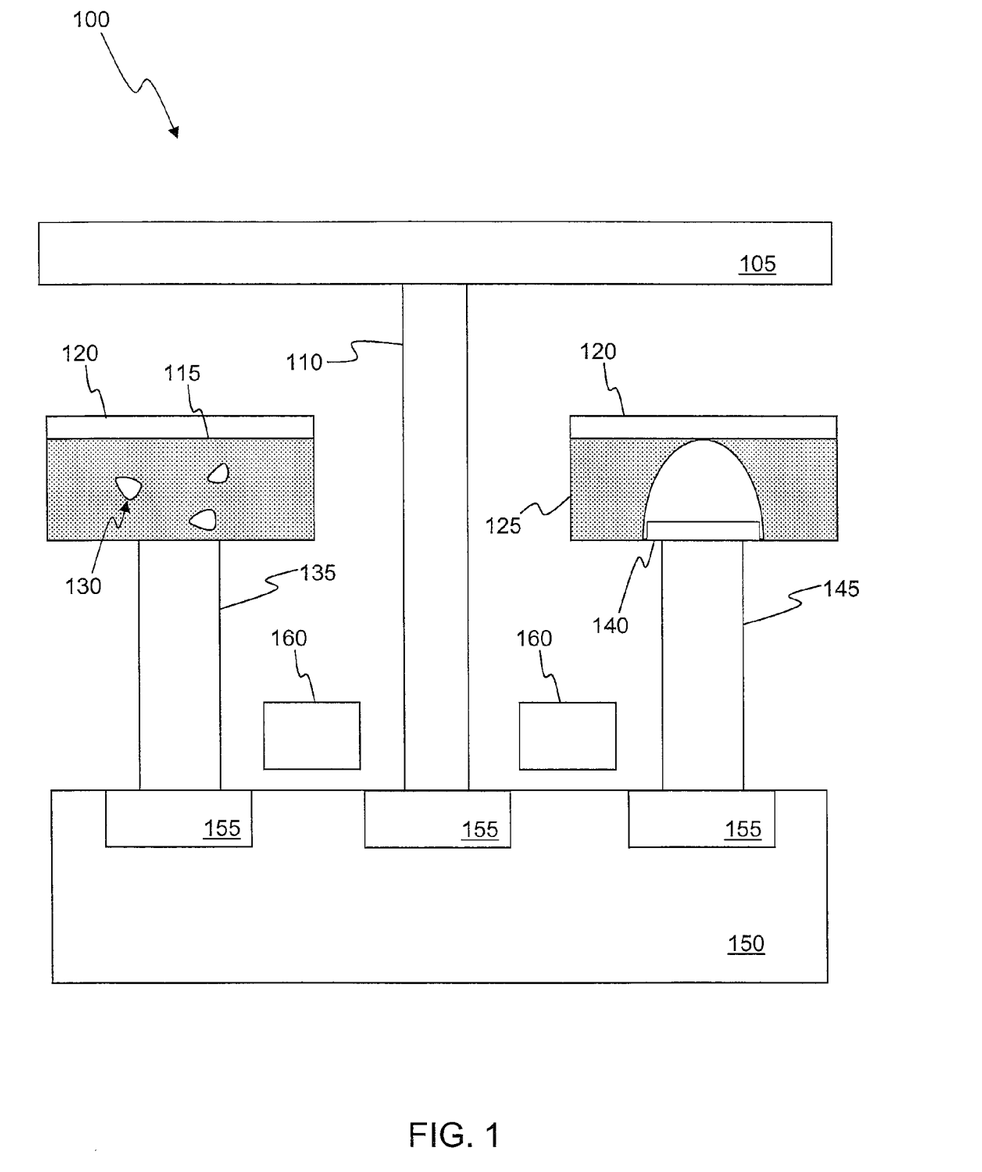
FIG. 1 is a schematic view of a portion of phase change memory, according to an embodiment.

FIG. 1 is a schematic view of a portion of phase change memory 100, according to an embodiment. Such a portion is shown to include two memory cells, each memory cell being in a different memory state for illustrative purposes. A semiconductor substrate 150 may include N-doped regions 155, though other configurations, including the use of P-doped regions for example, may be used. Phase change memory 100 may include word lines 160, bit line 105, and bit line contact 110. To represent one memory state, a heater 145 contacting a portion of phase change material 125 may heat to melt a portion 140 of phase change material 125, which may then be cooled relatively quickly to comprise amorphous GST, for example. Such an amorphous material may be relatively highly resistive, resulting in a high-resistance connection to a contact 120. To represent another memory state, a heater 135 contacting a portion of phase change material 115 may heat to melt a portion of phase change material 115, which may then be cooled relatively slowly to comprise a polycrystalline, low-resistance material. Such polycrystalline phase change material 115 may thus lead to a low-resistance connection to contact 120. Of course, details of such a portion of a PCM are merely examples, and claimed subject matter is not so limited.

As indicated above, phase change material 115 may develop voids 130, resulting from migration of phase change material and/or impurity elements during operation of a PCM. Such voids 130 may detrimentally increase resistance of a connection to contact 120, leading to malfunctioning of the memory cell. For example, such a failed memory cell may fail to switch memory states and/or properly write data, thus eliminating and/or reducing a size/number of such voids 130 may benefit memory cell operation, as discussed further below.

Figure 2:
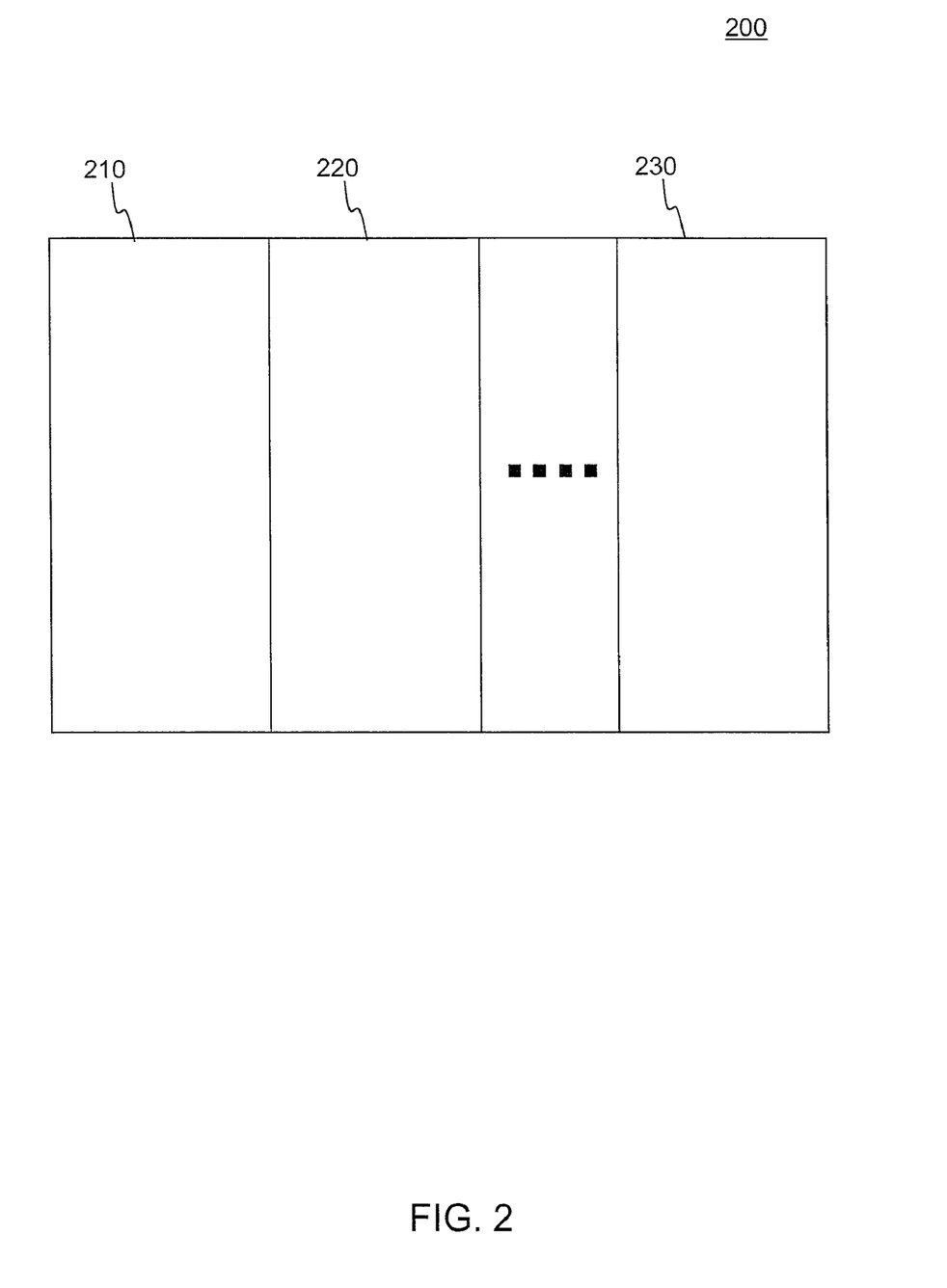
FIG. 2 is a schematic view of memory partitions, according to an embodiment.

FIG. 2 is a schematic view of memory partitions, according to an embodiment. A PCM memory 200 may be partitioned into partitions 210, 220, 230, though such a quantity and/or sizes of partitions are merely examples, and claimed subject matter is not so limited. A memory controller and/or special purpose processor (shown in FIG. 7) may carry out such partitioning, for example, though claimed subject matter is not so limited. In a particular embodiment, after a period of operating a PCM in a storage mode, one or more partitions, such as partition 210, may be selected for a memory cell maintenance process. Such a process may comprise applying a maintenance pulse to one or more memory cells of partition 210 in order to reduce and/or eliminate voids and/or defects that may result from an earlier storage mode of operation. In one particular implementation, a maintenance process may be applied to one partition 210 while one or more other partitions 220 and/or 230 are operating in a storage mode. Thereafter, for example, a maintenance process may be sequentially applied to another partition 220 while other partitions 210 and/or 230 are returned and/or remain in a storage mode. Selecting portions and/or partitions to be subjected to a maintenance process may be performed in a predetermined sequence. Alternatively, such selecting may be based, at least in part, on frequency and/or quantity of use of a particular portion and/or partition, since greater use of a memory (operating in storage mode) may lead to developing voids in a phase change material. In another alternative implementation, such selecting may be based, at least in part, on detecting errors and/or a measured bit error rate (BER) of a particular portion and/or partition of memory, since errors may be indicative of a presence of voids in a phase change material.

Figure 3:
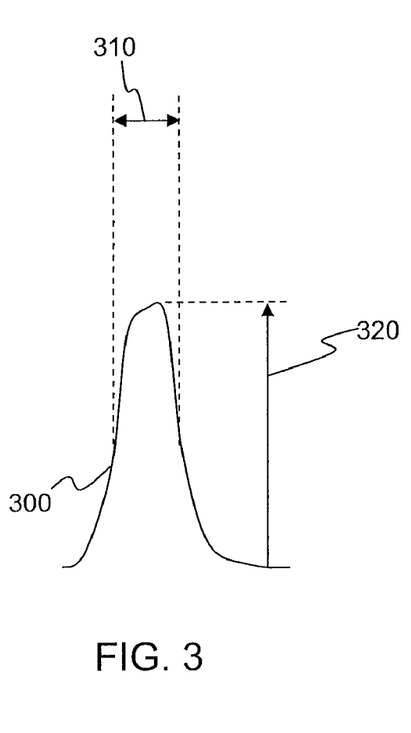
FIG. 3 is a schematic view of a write pulse wave-form, according to an embodiment.

FIG. 3 is a schematic view of a write pulse wave-form, according to an embodiment. Such a write pulse 300 may be applied to a memory cell during storage mode operation, for example, to change a stored bit of information. A combination of duration 310, current magnitude 320, and/or wave-form slope may lead to melting of phase change material followed by quenching or crystallization, which may yield a stored bit represented by a high-resistance state. Subjecting a memory cell to many write pulses 300 during memory cell operation may lead to formation of voids, as discussed above. Such voids, however, may be reduced in size and/or number by applying a maintenance pulse, discussed in further detail below.

Figure 4:
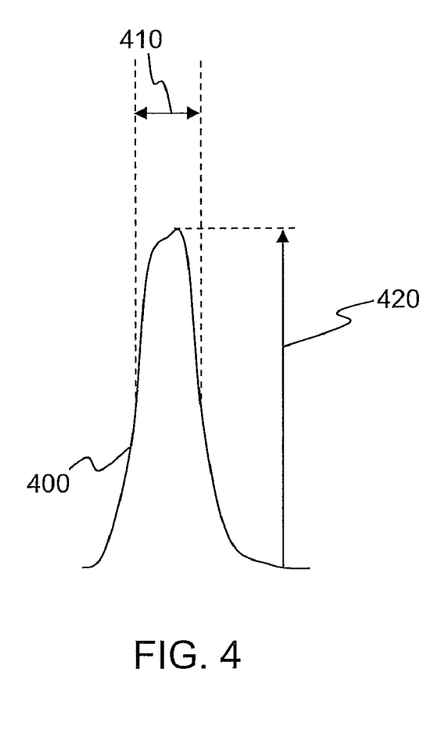
FIG. 4 is a schematic view of a maintenance pulse waveform, according to an embodiment.

FIG. 4 is a schematic view of a maintenance pulse wave-form, according to an embodiment. Such a maintenance pulse 400 may be applied to a memory cell during a maintenance process, for example, to reduce and/or eliminate voids, as discussed above. A combination of duration 410 and current magnitude 420, which may be greater than or equal to current magnitude 320 of write pulse 300, may lead to melting of phase change material and a concomitant reduction and/or elimination of voids. Subsequent to such a maintenance pulse, a repaired memory cell, free of voids (or having a substantially reduced number of voids) may be returned to a storage mode of operation, though claimed subject matter is not so limited.

Figure 5:
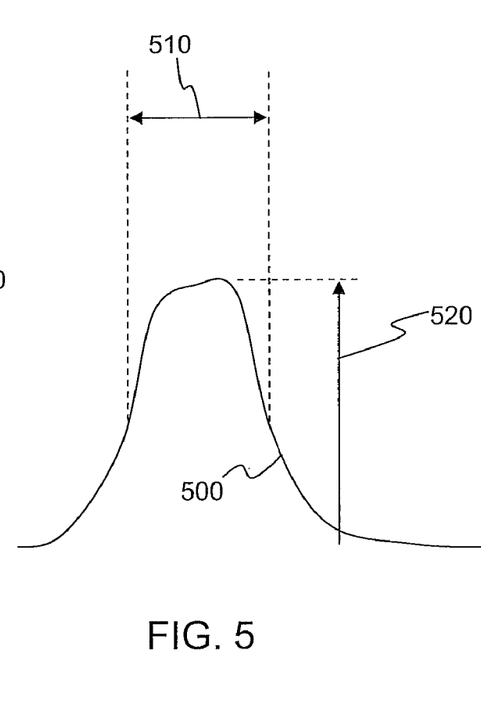
FIG. 5 is a schematic view of a maintenance pulse waveform, according to another embodiment.

FIG. 5 is a schematic view of a maintenance pulse waveform, according to another embodiment. Such a maintenance pulse 500 may be applied to a memory cell during a maintenance process, for example, to reduce and/or eliminate voids, as discussed above. A combination of duration 510 and current magnitude 520 may lead to melting of phase change material and a concomitant reduction and/or elimination of voids. Duration 510 may be greater than or equal to duration 310 of write pulse 300, and greater than or equal to duration 410 of maintenance pulse 400. Also, current magnitude 520 may be greater than or equal to current magnitude 320 of write pulse 300, but less than or equal to current magnitude 420 of maintenance pulse 400. Accordingly, comparing maintenance pulses 400 and 500, various combinations of current magnitude and duration of applied current may be used as a maintenance pulse. A common aspect of such various combinations, however, is that current magnitude of such maintenance pulses applied to a memory cell may be greater than or equal to a current magnitude of a write pulse used during a previous storage mode of operation of the memory cell. Of course, such details of magnitude and duration of maintenance and write pulses are merely examples, and claimed subject matter is not so limited.

Figure 6:
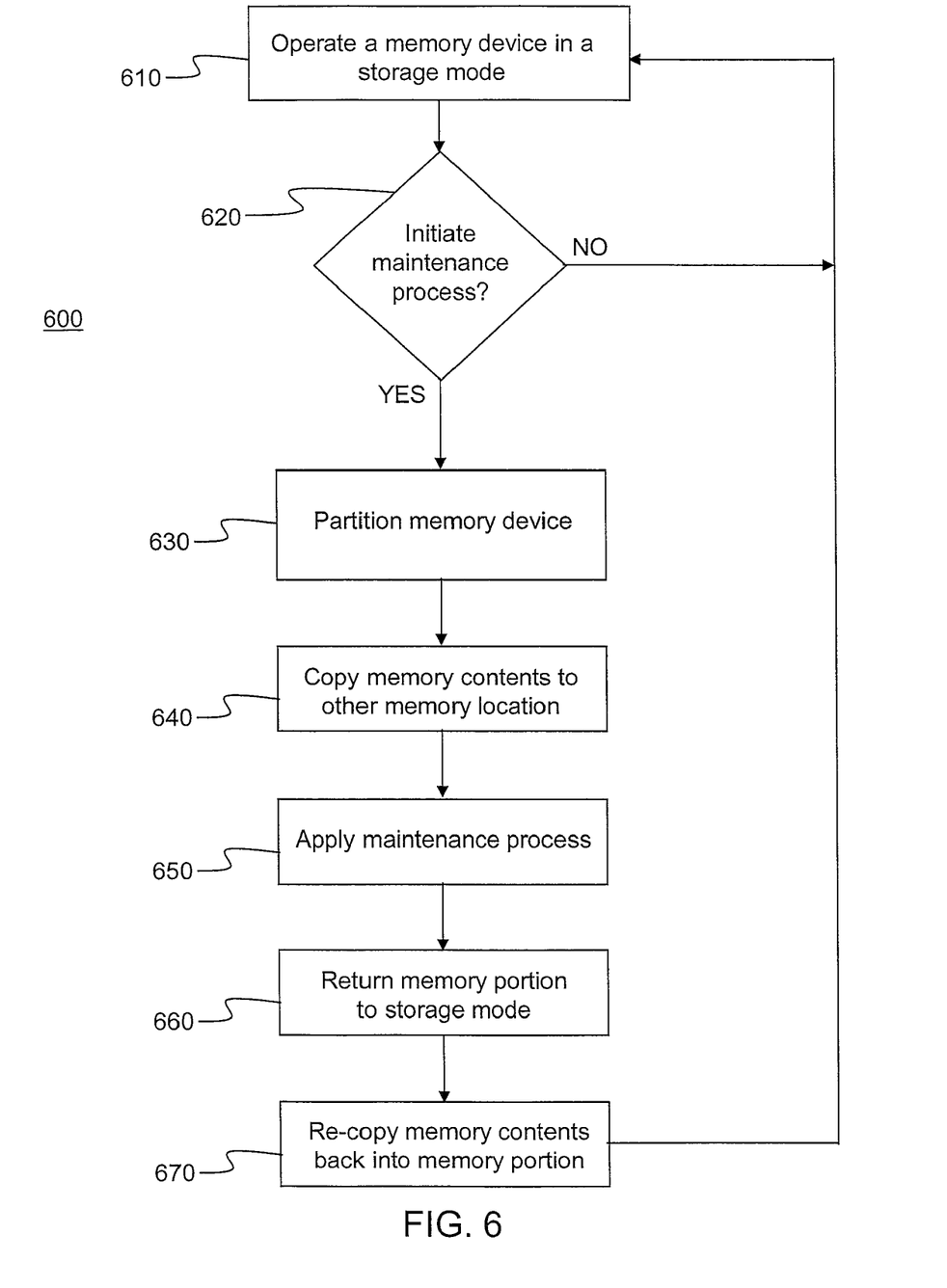
FIG. 6 is a flow diagram of a maintenance process, according to an embodiment.

FIG. 6 is a flow diagram of a process 600 that includes a maintenance process, according to an embodiment. Such a process may be applied to at least a portion of a memory device, such as PCM memory 200 shown in FIG. 2, for example. At block 610, memory device may be operated in a storage mode during which cycling memory cells among different states (e.g., binary states) of such a memory device may lead to voids. As discussed above, if left unchecked, such voids may lead to failure of a memory device. Accordingly, at block 620, a maintenance process may be initiated as a preventive measure before such memory failures occur. As discussed above, initiating a maintenance process may be based, at least in part, on a predetermined time schedule, frequency and/or quantity of use, and/or detecting errors and/or a measured bit error rate (BER) of a particular portion and/or partition of a memory device. If a determination is made not to initiate a maintenance process, then process 600 may return to block 610 where a memory device may continue to operate in a storage mode. On the other hand, if a determination is made to initiate a maintenance process, then process 600 may proceed to block 630 where a memory device may be partitioned into one or more portions. In such a case, a maintenance process may be applied to one portion of memory while another portion of memory continues to operate in a storage mode. At block 640, memory contents of a memory portion that will be subjected to a maintenance process may be copied to another portion of memory, since, in one particular implementation, a maintenance process may erase such memory contents. After a maintenance process for a particular portion of memory is complete, copied memory contents may be returned (re-written) to the particular portion of memory. In one embodiment, a portion of memory to receive copied memory contents may comprise a portion of a memory device reserved for such use. To avoid overwriting and/or erasing copied memory content while storing such memory content for another portion of memory being subjected to a maintenance process, such a portion of a memory device may be kept from receiving write and/or erase operations. In an alternative embodiment, such copied memory contents may be copied into a particular portion of memory that may be operated in a storage mode, wherein such memory contents may be accessed by a processor. In such a case, for example, a particular portion of memory storing memory contents from another portion of memory being subjected to a maintenance process may be overwritten, read, and/or erased by a processor. In one implementation, such a portion of memory to receive such copied memory contents need not comprise a portion of the same memory device, but may be external (e.g., another memory device) to the memory device. Of course, such processes applied to a memory device are merely examples, and claimed subject matter is not so limited.

At block 650, a maintenance process may be applied to a portion of memory, wherein maintenance pulses, such as those shown in FIGS. 4 and 5 are applied to one or more memory cells of a portion of memory. At block 660, after being subject to a maintenance process, a portion of memory may be returned to a storage mode of operation. Subsequently, at block 670, memory contents originally copied from a portion of memory subjected to a maintenance process may be re-copied back to such a portion of memory. In an alternative embodiment, as mentioned above, such copied memory contents need not be re-copied back to a portion of memory that underwent a maintenance process.

Figure 7:
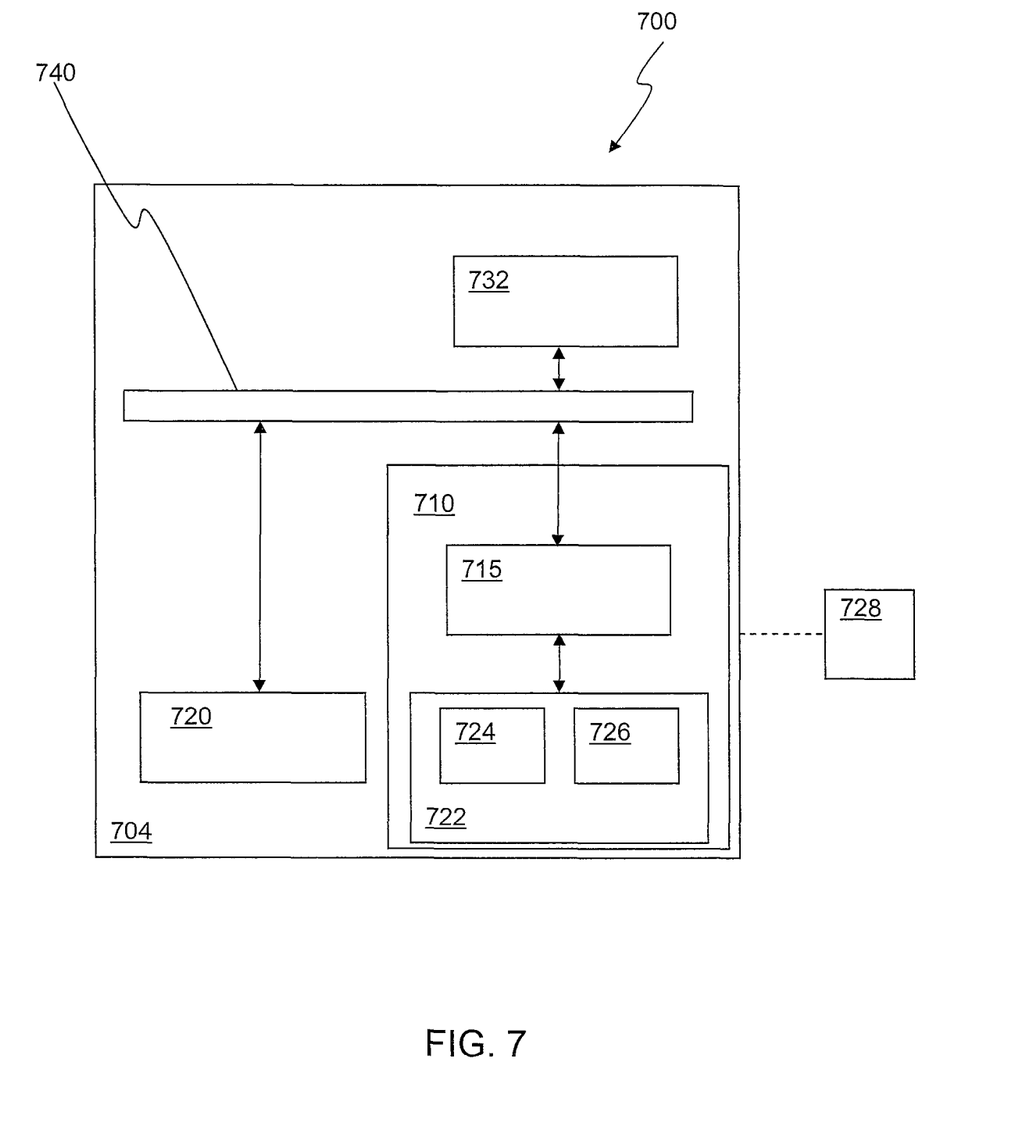
FIG. 7 is a schematic diagram illustrating an exemplary embodiment of a computing system.

FIG. 7 is a schematic diagram illustrating an exemplary embodiment of a computing system 700 including a memory device 710, to which one or more maintenance processes may be applied, as described above for example. A computing device 704 may be representative of any device, appliance, and/or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process, such as a maintenance process described above, for example. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may communicate with memory controller 715 to process memory-related operations, such as read, write, and/or erase, as well as memory partition processes discussed above, for example. Processing unit 720 may include an operating system configured to communicate with memory controller 715. Such an operating system may, for example, generate commands to be sent to memory controller 715 over bus 740. Such commands may include instructions to initiate a maintenance process including, but not limited to, partitioning at least a first portion of memory for such a maintenance process, to copy information stored in the first portion of memory into another portion of memory, and to apply one or more maintenance pulses to the first portion of memory, for example.

Memory 722 is representative of any data storage mechanism. Memory 722 may include, for example, a primary memory 724 and/or a secondary memory 726. In a particular embodiment, memory 722 may comprise memory that may be partitioned based at least in part on one or more attributes of the memory and/or a memory management process, as described above. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code and/or instructions for one or more of the devices in system 700.

In one implementation, processing unit 720 may host one or more applications to initiate commands to memory controller 715 to store information in and/or retrieve information from a memory device. Such applications may comprise word processing applications, voice communication applications, navigation applications, and so on. For example, memory controller 715, responsive to commands initiated from processing unit 720, may apply a memory cell maintenance process to a portion of a memory device by supplying a portion of the non-volatile memory device with a maintenance pulse. Such a maintenance pulse may comprise a current amplitude and/or a current duration greater than or equal to that of a write pulse applied to a memory device during memory device operation.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Some portions of the detailed description above are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In one example, such a special purpose computer or special purpose electronic computing device may comprise a general purpose computer programmed with instructions to perform one or more specific functions. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   operating a non-volatile phase change memory device in a storage mode with a write pulse comprising a first current amplitude and a first duration;
   partitioning said non-volatile memory device into at least a first portion and a second portion;
   applying a memory cell maintenance process to said first portion to operate said first portion with a maintenance pulse, wherein said maintenance pulse comprises a polarity that is the same as a polarity of said write pulse; and
   returning said first portion to operate in said storage mode.

2. The method of claim 1, wherein applying said memory cell maintenance process further comprises:
   applying said maintenance pulse to one or more memory cells of said first portion, wherein said maintenance pulse comprises a second current amplitude that is greater than or equal to said first current amplitude and/or a second duration that is greater than or equal to said first duration.

3. The method of claim 1, further comprising:
   subsequent to returning said first portion to operate in said storage mode, applying said memory cell maintenance process to said second portion to operate said second portion with said maintenance pulse; and
   returning said second portion to operate in said storage mode.

4. The method of claim 1, wherein said non-volatile memory device comprises a phase change memory (PCM) that includes a phase-change material.

5. The method of claim 4, wherein said maintenance pulse is sufficient to melt said phase-change material.

6. The method of claim 5, wherein said phase-change material comprises germanium antimony telluride (GST).

7. The method of claim 1, further comprising:
   before applying said memory cell maintenance process to said first portion, copying information stored in said first portion to a third portion of said non-volatile memory device, wherein said applying said memory cell maintenance process to said first portion results in said first portion being erased.

8. The method of claim 7, further comprising:
   after applying said memory cell maintenance process to said first portion, copying said information stored in said third portion to said first portion of said non-volatile memory device.

9. The method of claim 7, further comprising:
   applying said memory cell maintenance process to said first portion in response to detecting one or more bit errors from said first portion.

10. A non-volatile phase change memory device comprising:
    a memory cell array; and
    a controller to:
       operate said memory cell array in a storage mode with a write pulse comprising a first current amplitude and a first duration;
       partition said memory cell array into at least a first portion and a second portion;
       apply a memory cell maintenance process to said first portion to operate said first portion with a maintenance pulse, wherein said maintenance pulse comprises a polarity that is the same as a polarity of said write pulse; and
return said first portion to operate in said storage mode.

11. The non-volatile memory device of claim 10, wherein said memory cell maintenance process comprises said maintenance pulse applied to one or more memory cells of said first portion, wherein said maintenance pulse comprises a second current amplitude that is greater than or equal to said first current amplitude and/or a second duration that is greater than or equal to said first duration.

12. The non-volatile memory device of claim 10, wherein said controller is adapted to:
apply said memory cell maintenance process to said second portion subsequent to returning said first portion to operate in said storage mode; and
return said second portion to operate in said storage mode.

13. The non-volatile memory device of claim 10, further comprising a phase change memory (PCM) that includes a phase-change material.

14. The non-volatile memory device of claim 13, wherein said maintenance pulse is sufficient to melt said phase-change material.

15. The non-volatile memory device of claim 14, wherein said phase-change material comprises germanium antimony telluride (GST).

16. A system comprising:
a non-volatile phase change memory device writeable by a pulse comprising a first current amplitude and a first duration;
a controller to apply a memory cell maintenance process to a portion of said non-volatile memory device by supplying said portion of said non-volatile memory device with a maintenance pulse, wherein said maintenance pulse comprises a polarity that is the same as a polarity of said pulse, and wherein said maintenance pulse comprises a second current amplitude and/or a second current duration greater than or equal to said first current amplitude and/or first current duration, respectively; and
a processor to host one or more applications to initiate commands to said controller to store information in and/or retrieve information from said non-volatile memory device.

17. The system of claim 16, wherein said controller is adapted to partition said non-volatile memory device to a first portion subject to said memory cell maintenance process and a second portion to store memory contents of said first portion while said first portion is subject to said memory cell maintenance process.

18. The system of claim 17, wherein said controller is adapted to:
apply said memory cell maintenance process to said second portion to operate said second portion with said maintenance pulse.

19. The system of claim 16, wherein said non-volatile memory device comprises a phase change memory (PCM) that includes a phase-change material.

20. The system of claim 19, wherein said maintenance pulse is sufficient to melt said phase-change material.

* * * * *